United States Patent [19]

Kuo

[11] Patent Number: 5,701,102

[45] Date of Patent: Dec. 23, 1997

[54] HIGH-SPEED TRANSMISSION LINE RECEIVER WITH WIDE RANGE OF COMMON MODE COMPENSATION

[75] Inventor: James R. Kuo, Cupertino, Calif.

[73] Assignee: National Semiconductor Corporation, Santa Clara, Calif.

[21] Appl. No.: 567,359

[22] Filed: Nov. 29, 1995

[51] Int. Cl.$^6$ ............................................. H03F 3/45
[52] U.S. Cl. ........................................ 330/253; 330/258
[58] Field of Search ................................. 330/253, 257, 330/258

[56] References Cited

U.S. PATENT DOCUMENTS 5,063,305  11/1991  Minami et al. ............... 330/257 X
5,276,369   1/1994  Hayakawa et al. ............ 330/253 X

FOREIGN PATENT DOCUMENTS 6164261  6/1994  Japan ............................ 330/253

OTHER PUBLICATIONS

De La Plaza et al. "Power Supply Rejection in Differential Switche–Capacitor Filters", IEEE Journal of Solid–State Circuits, vol. SC-19, No. 6, Dec. 1984 pp. 912–918.

Primary Examiner—James B. Mullins
Attorney, Agent, or Firm—Skjerven, Morrill MacPherson, Franklin & Friel; David E. Steuber

[57] ABSTRACT

A high-speed transmission line receiver includes a basic differential amplifier stage along with a gain enhancement stage, which is generally similar to the differential amplifier stage. One of the current mirror transistors in the gain enhancement stage is connected to one of the current mirror transistors in the basic amplifier stage in such a way that the magnitude of the differential current at the output of the basic amplifier stage is increased, thereby increasing the gain of the receiver without increasing its output capacitance or the time constant of the output signal. Preferably, the transistors in the gain enhancement stage are larger than the transistors in the basic amplifier stage. Increasing the gain of the line receiver reduces the distortion which may occur as a result of the failure of the line receiver to reach a clamping voltage as the common mode of the differential input signal is increased.

20 Claims, 9 Drawing Sheets

HIGH-SPEED TRANSMISSION LINE RECEIVER WITH WIDE RANGE OF COMMON MODE COMPENSATION

FIELD OF THE INVENTION

This invention relates to transmission line receivers and, in particular, to a differential transmission line receiver which combines the characteristics of high-speed, high-gain and low-power consumption while providing minimal distortion at a wide range of common mode voltages.

BACKGROUND OF THE INVENTION

Data exchanges at high transmission rates (e.g., 350M bits/sec or more) raise a number of critical issues at both the transmitting and receiving terminals. One of these issues is signal distortion. The greater the signal distortion, the smaller the window during which the data must be sampled. This factor becomes particularly important at high transmission rates.

In many receivers, the level of distortion becomes greater as the common mode voltage increases. How this occurs can be explained as follows, with reference to FIG. 1, which shows a differential amplifier 10 and a second stage 11. Differential amplifier 10 is a conventional differential amplifier which includes a current-splitting pair of P-channel MOSFETs M1 and M2 and a current-mirror pair of N-channel MOSFETs M3 and M4. The tail current $I_{ss}$ is produced by current-mirroring a current $I_{dc}$ from a current source I via a pair of MOSFETs M5 and M6. Differential input voltages V+ and V− are applied to the gates of PMOSFETs M1 and M2, respectively, and produce a voltage $V_o+$ at the drain of PMOSFET M2. A current associated with $V_o+$ flows into a buffer amplifier A, which amplifies $V_o+$ and delivers an output voltage $V_o$.

Figure 1:
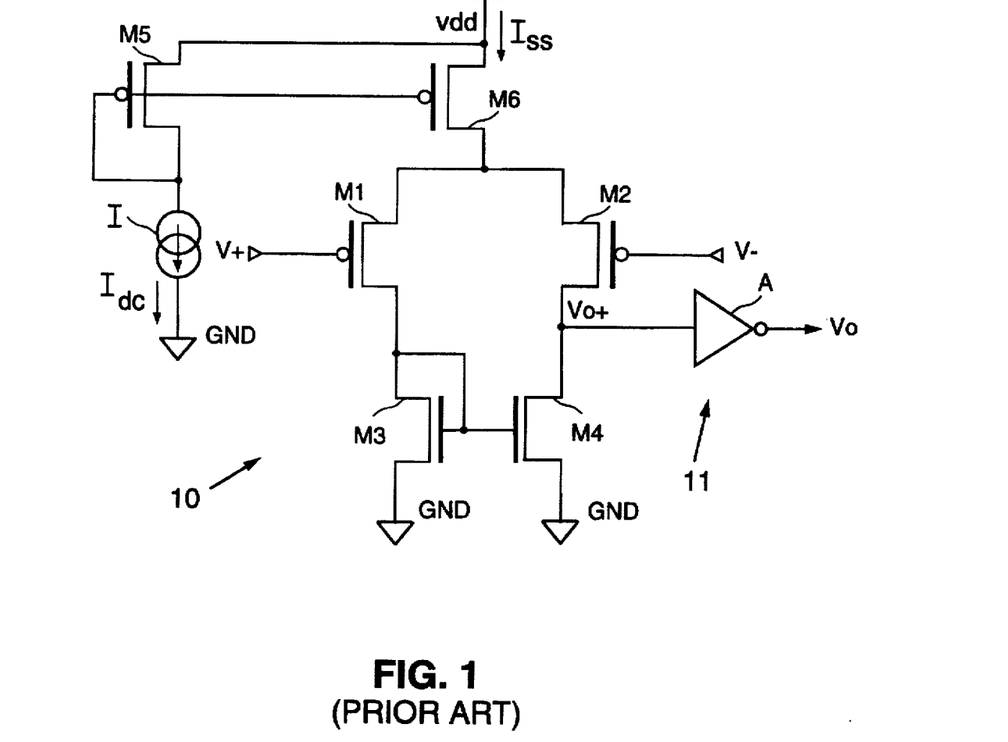
FIG. 1 illustrates a schematic circuit diagram of a conventional differential amplifier.

The small signal gain $A_v$ of differential amplifier 10 is defined by the following equation:

$$A_v = \frac{\Delta V_o+}{V_{diff}} = \frac{G_{md}}{G_0} \quad (1)$$

where $V_{diff}=(V+-V-)/2$, $G_{md}$ is the differential transconductance and $G_o$ is the output conductance at $V_o+$.

Equation (1) can be rewritten as follows:

$$A_v = \sqrt{K \frac{W_2}{L_2} I_{ss}} / \frac{I_{ss}}{2}(\lambda_2 + \lambda_4) \quad (2)$$

$$A_v = 2\sqrt{K \frac{W_2}{L_2}} / \sqrt{I_{ss}}(\lambda_2 + \lambda_4) \quad (3)$$

where $W_2$ and $L_2$ are the channel width and length, respectively, of PMOSFET M2, $\lambda_2$ and $\lambda_4$ are the channel length modulation parameters of PMOSFET M2 and NMOSFET M4, respectively, and K is the transconductance of MOSFETs M1 and M2.

Figure 2:
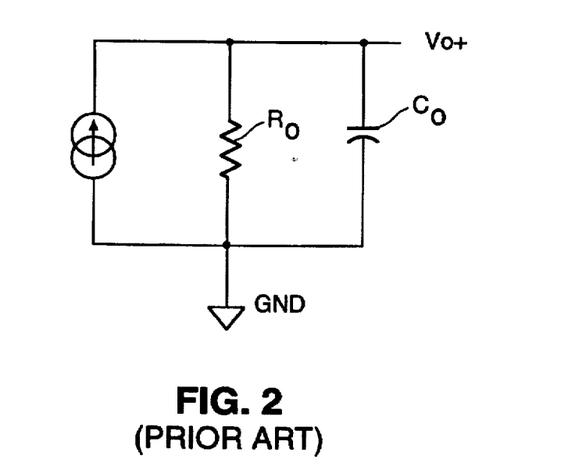
FIG. 2 illustrates an equivalent circuit of the differential amplifier shown in FIG. 1.

FIG. 2 illustrates the equivalent circuit at the drain of PMOSFET M2, with $R_o$ and $C_o$ representing the output impedance at that node. The current $I_o$ generated by the current source is equal to $G_{md}V_{diff}$. The time response of $V_o+$ is thus described as follows:

$$V_o+ = G_{md}(V_{diff} \cdot R_o)\left(1 - e^{-\frac{t}{R_oC_o}}\right) \quad (4)$$

Assuming that $t \ll R_oC_o$, this relationship can be approximated as follows:

$$V_o+ \cong G_{md}V_{diff}\left(\frac{t}{C_o}\right) \quad (5)$$

Referring again to FIG. 1, it is apparent that $V_o+$ must at all times remain within a range bounded by a positive clamping voltage $V_{c1}+$ and a negative clamping voltage $V_{c1}-$. $V_{c1}+$ and $V_{c1}-$ are defined as follows:

$$V_{c1}+=V_{gs2}-V_{sd2}+V_{cm} \quad (6)$$

where $V_{gs2}$ is the source-to-gate voltage of MOSFET M2, $V_{sd2}$ is the source-to-drain voltage of MOSFET M2, and $V_{cm}$ is the common mode input voltage, i.e., $V_{cm}=(V++V-)/2$. For this purpose, it is assumed that the common mode voltage $V_{cm} \gg V_{diff}$ so that $V+=V- \approx V_{cm}$. In other words, the fluctuations in V+ and V− are assumed to be very small in comparison to the common mode voltage $V_{cm}$.

$V_{c1}-$ is defined as follows:

$$V_{c1}- \cong \frac{i_{d4}}{K_n \frac{W_4}{L_4}(V_{gs4}-V_t)} \quad (7)$$

where $i_{d4}$ is the drain current in MOSFET M4 in the linear region, $K_n$ is the transconductance for an N-channel MOSFET, $W_4$ and $L_4$ are the width and length, respectively, of the channel of MOSFET M4, $V_{gs4}$ is the source-to-gate voltage of MOSFET M4, and $V_t$ is the N-channel threshold of MOSFET M4.

As $V_o+$ swings upward, it becomes clamped when it equals $V_{c1}+$. Using Equation (5) and letting $V_o+=V_{c1}+$ yields:

$$V_o+ \cong G_{md}V_{diff}\left(\frac{t}{C_o}\right) = V_{c1} \quad (8)$$

Solving Equation (8) for the time $t_{c1}$ at which $V_o+$ becomes clamped yields:

$$t_{c1} \cong \frac{C_o}{G_{md}} \cdot \frac{V_{c1}+}{V_{diff}} \quad (9)$$

For a given fabrication process (channel length is 0.8 µm and gate oxide thickness is 150 A), the parameters used in the above equations have the following values; $K_n=20$ µm/V$^2$; $\lambda_n=0.034$ V$^{-1}$; $\lambda_p=0.095$ V$^{-1}$. Assume further that W/L=20 and $I_{ss}=200$ µm. If V+ and V− vary peak-to-peak between 0.1 V and 0.0 V, then $V_{gs2}$ can be computed to be approximately 1.8 V, and $V_{sd2}$ can be computed to be approximately 0.2 V. Thus, $V_{c1}+=1.6$ V+V−, and $V_{c1}-=0.24$ V.

In addition, the following parameters can be calculated:

$$G_{md} = \sqrt{K_p \frac{W}{L} I_{ss}} = 283 \text{ µA/V} \quad (10)$$

$$r_{4n} = \frac{1}{\frac{1}{2} I_{ss}\lambda_n} = 294 \text{ K}\Omega \quad (11)$$

$$r_{2p} = \frac{1}{\frac{1}{2} I_{ss}\lambda_p} = 105 \text{ K}\Omega \quad (12)$$

where $r_{4n}$ is the impedance of NMOSFET M4 and $r_{2p}$ is the impedance of PMOSFET M2. Thus $R_o$ (FIG. 2), equals $r_{2p}$—$r_{4n}=77$ kΩ. And using Equation (4), absent clamping $V_o+$ would asymptotically approach 2.1 V.

$G_{md}V_{diff}R_o=283$ µA/V·0.1 V·77 kΩ=2.1 V

However, since $V_{cm}=0.05$ V, $V_o+$ is clamped at $V_{c1}+=1.6$ V+0.05 V=1.65 V.

Figure 3A:
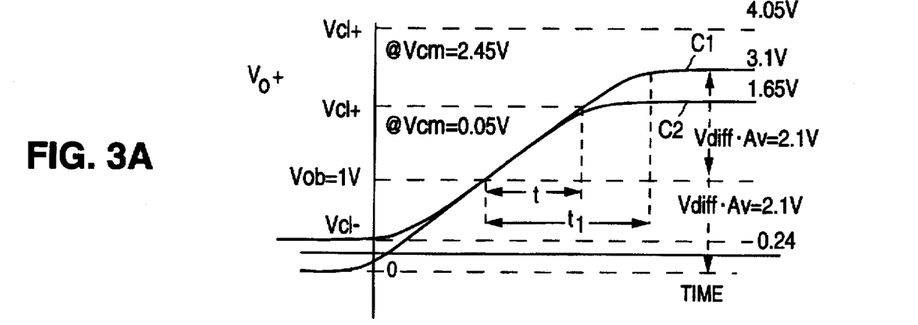
FIGS. 3A and 3B illustrate graphs which show the behavior of the output signal $V_o+$ of the differential amplifier in response to a transition of the input signal V+ from low to high.

This situation is illustrated in FIG. 3A. $V_{ob}$, the level of $V_o+$ when the differential input voltages are balanced (i.e., $V+=V-$), is equal to 1.0 V. Curve C1 in FIG. 3A shows that $V_o+$ would rise asymptotically towards a level of 1.0+2.1= 3.1 V if clamping did not occur. However, with $V_{cm}$ at 0.05 V, $V_o+$ is clamped at 1.65 V after a time t has elapsed. This is shown by curve C2.

Figure 4A:
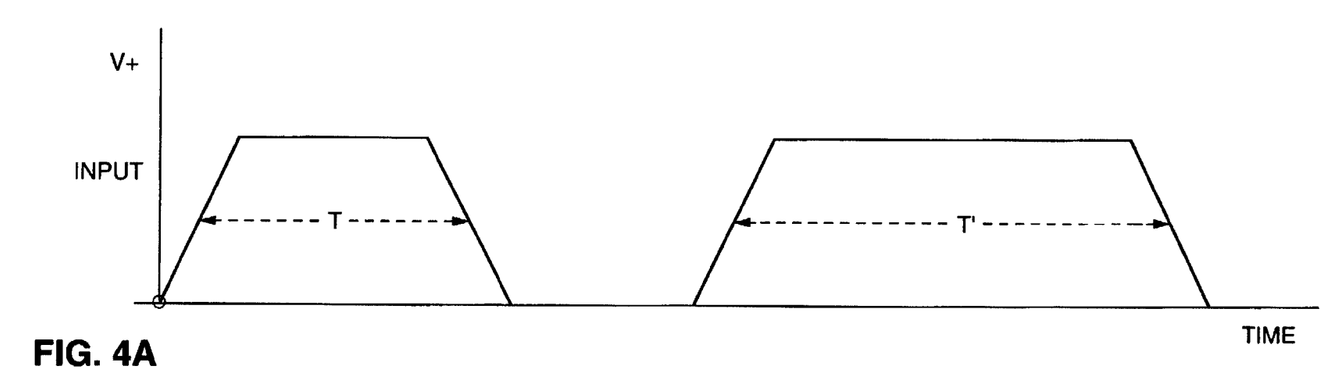
FIG. 4A illustrates a graph showing two cycles of the input signal V+ of the differential amplifier from low to high and back to low.
Figure 4B:
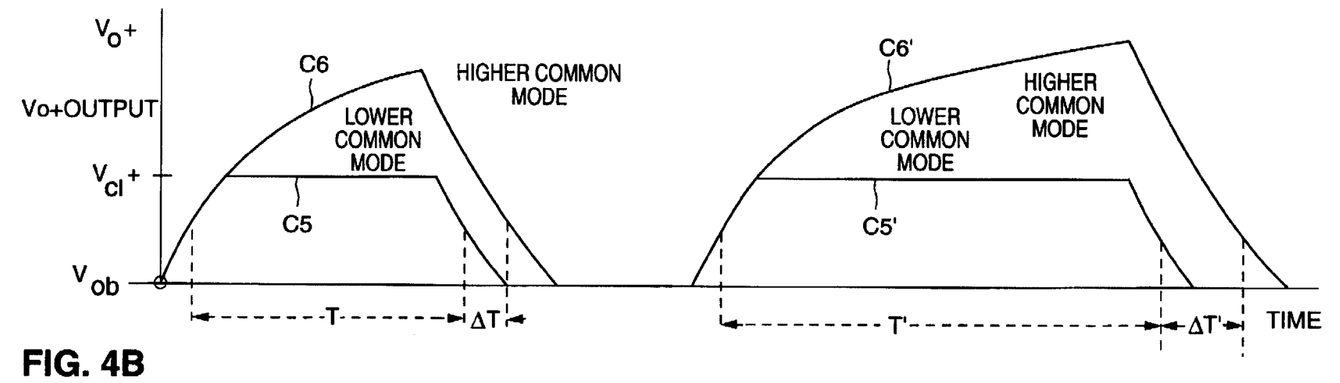
FIG. 4B illustrates a graph showing the behavior of the output signal $V_o+$ of the differential amplifier in response to the input signals shown in FIG. 4A.

Suppose, for example, that $V_{diff}$ remains at 0.1 V but $V_{cm}$ is increased to 2.45 V, with V+ and V− fluctuating between 2.4 V and 2.5 V. $V_{c1}+$ then rises to 1.6 V+2.45 V=4.05 V. As shown by curve C1 in FIG. 3A, after time t has elapsed $V_o+$ is still rising asymptotically towards 3.1 V without being clamped. In this situation, during high-speed switching V+ and V− may switch states while $V_o+$ is still increasing at a significant rate. The consequence is shown in FIGS. 4A and 4B. FIG. 4A shows V+ rising to a high level in two intervals having durations T and T', respectively. FIG. 4B shows the behavior of $V_o+$ during the same intervals, assuming two levels of common mode voltage. The curve labelled C5 is for a relatively low $V_{cm}$, and shows $V_o+$ being clamped at $V_{c1}+$. The curve labelled C6 is for a relatively high $V_{cm}$, and shows $V_o+$ rising unclamped. When V+ switches low, curves C5 and C6 begin to fall at the same time but, because curve C6 is at a substantially higher level it reaches the horizontal axis ($V_{ob}$) at a time ΔT after curve C5.

So long as curve C6 continues to rise (i.e., remains unclamped) its level when $V_o+$ switches low, and consequently the time it takes to decay to $V_{ob}$, will depend on the length of time that $V_o+$ remains high. This is apparent from curves C5' and C6' (which correspond to curves C5 and C6, respectively) on the righthand side of FIGS. 4A and 4B. When V+ remains high for a duration T', the unclamped $V_o+$, represented by curve C6', reaches the horizontal axis ($V_{ob}$) at a time ΔT' after curve C5' (ΔT' being longer than ΔT). In contrast, the decay time for the clamped $V_o+$, represented by curves C5 and C5', is independent of the time that V+ remains in a high state.

Figure 5:
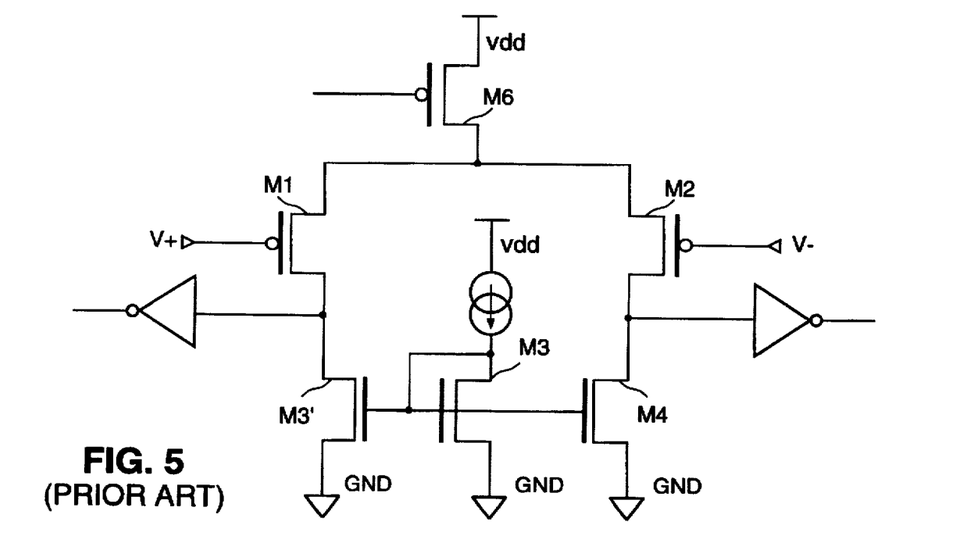
FIG. 5 illustrates a schematic circuit diagram of a conventional amplifier which provides a differential output in response to a differential input.

This distortion problem is even more severe in the differential-input to differential-output amplifier shown in FIG. 5. With the same tail current $I_{ss}$ as the single-ended output version, each of the differential outputs $V_o+$ and $V_o-$ has one-half the gain of the single-ended output shown in FIG. 1. Thus clamping is even less likely to occur.

There is a need for a high-speed receiver which does not experience the signal distortion described above. The receiver should also be capable of detecting a small input signal (e.g., as low as 100 mV peak-to-peak) with a very small delay (e.g., less than 1 ns).

SUMMARY OF THE INVENTION

Embodiments according to this invention reduce the distortion problem in receivers by increasing the gain of the differential amplifier. Increasing the gain increases the likelihood that the output voltage will become clamped at all levels of common mode voltage and that the decay time of the output voltage when the input signal switches from high to low will be consistent, regardless of how long the input signal has been in a high state.

In a first embodiment, a gain enhancement stage is connected to a basic differential amplifier. The gain enhancement stage is similar in structure to the basic differential amplifier, but the input terminals are reversed and a terminal of the one of the current mirror transistors in the basic amplifier is connected to opposite current mirror transistor in the gain enhancement stage. In one version, the current mirror transistor having shorted terminals in the basic amplifier is connected to the current mirror transistor in the gain enhancement stage which does not have shorted terminals. To further improve the gain, the current-splitting transistors in the gain enhancement stage are designed to carry larger currents, as by having greater channel width-to-length ratios, than the current-splitting transistors in the basic amplifier.

In a second embodiment, a high-gain amplifier having differential outputs is constructed by adding a second basic differential amplifier and a second gain enhancement stage. The input terminals of the second basic differential amplifier and second gain enhancement stage are reversed, with the result that a complementary output signal is produced.

According to another aspect of the invention a common mode compensation circuit is provided. The common mode compensation circuit operates to increase the tail current in the basic differential amplifier and the gain enhancement stage as the common mode voltage increases. This has the effect of further increasing the gain of the overall structure beyond what is possible with the gain enhancement stage alone. The common mode compensation circuit includes a pair of current-splitting transistors, one of which is connected to the common mode voltage, and a pair of current-mirror transistors which mirror a current to the tail current.

In a third embodiment, a high-gain differential-input to differential-output amplifier includes a pair of differential amplifiers, each of which comprises a pair of current-splitting transistors and a pair of current-mirror transistors. The inputs to the differential amplifiers are reversed, and the differential amplifiers therefore provide complementary outputs.

Various combinations of the embodiments of the this invention can also be constructed. For example, a high-sensitivity line receiver can be constructed by connecting the differential output terminals of an amplifier of the second embodiment to the differential input terminals of an amplifier of the third embodiment, the differential output terminals of the amplifier of the third embodiment being connected to inverters. The high-sensitivity line receiver can include a common mode compensation circuit. Moreover, a medium-sensitivity line receiver can be constructed by connecting the differential output terminals of an amplifier of the third embodiment to the differential input terminals of another amplifier of the third embodiment, the differential output terminals of the latter being connected to inverters. A line receiver or CMOS translator can be constructed by connecting inverters to the differential output terminals of an amplifier of the third embodiment.

DESCRIPTION OF THE INVENTION

Figure 3B:
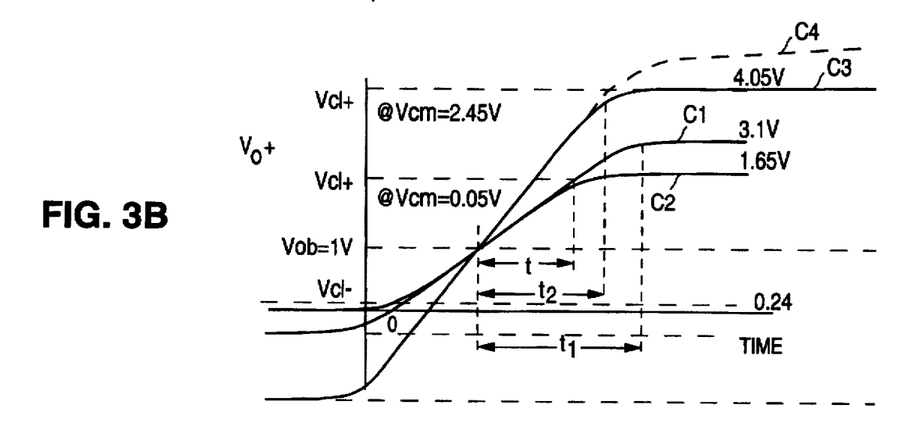

Distortion in a transmission line receiver can be reduced by increasing the gain of the receiver, which is equivalent to reducing the time constant of the output signal. This is illustrated in FIG. 3B, which is similar to FIG. 3A but includes a third curve C3 representing the output signal of an amplifier with a higher gain. Curve C3 reaches the higher $V_{c1}$ of 4.05 V after a time $t_2$ has elapsed, $t_2$ being only slightly longer than t. (The dashed curve C4 shows the behavior of $V_o+$ if it were not clamped at 4.05 V.) As the previous discussion indicates, an amplifier having a gain represented by curve C3 would be immune from significant distortion at any $V_{cm}$ up to 2.45 V. In contrast, an amplifier having again typified by curves C1 and C2 begins to experience distortion when $V_{cm}$ exceeds 0.05 V. Thus increasing the gain of the amplifier is one way of increasing the range of common mode voltages that may be used without incurring distortion in the output signal.

It is known to increase the gain of an amplifier by increasing the size (i.e., channel width) of the current-splitting MOSFETs. This has the disadvantage, however, of increasing the capacitance at the output node and consequently the time constant of the output signal.

Figures 6A, 6B:
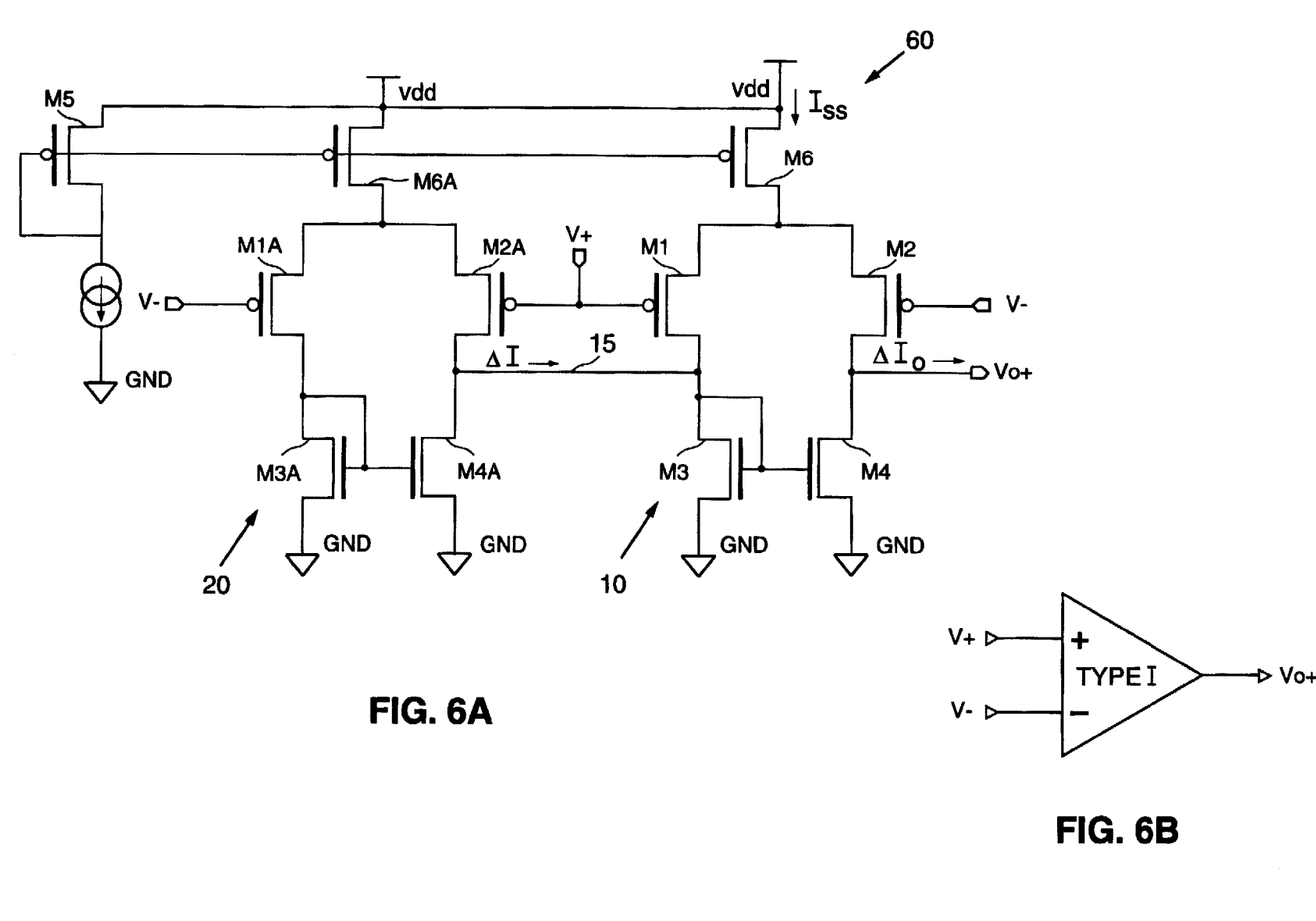
FIG. 6A illustrates a schematic circuit diagram of a differential amplifier in accordance with a first embodiment of the invention which includes a gain enhancement stage.
FIG. 6B illustrates a symbol used to designate a differential amplifier in accordance with the first embodiment of this invention.

FIG. 6A illustrates a schematic circuit diagram of a differential amplifier 60 according to a first embodiment of this invention. The differential amplifier 10 of FIG. 1 serves as the basic amplifier stage and is connected to a gain enhancement stage 20. Gain enhancement stage 20 includes a pair of current-splitting MOSFETs M1A and M2A and a pair of current mirror MOSFETs M3A and M4A. The V+ input is delivered to MOSFETs M1 and M2A and the V− input is delivered to MOSFETs M2 and M1A. Gain enhancement stage 20 is supplied with a tail current equal to $I_{ss}$ via a MOSFET M6A. The common node between the drain of PMOSFET M2A and the drain of NMOSFET M4A is connected via a line 15 to the common node between the drain of PMOSFET M1 and the drain of NMOSFET M3. As V+ and V− switch between their high and low states, a current ΔI which flows in line 15 changes in a direction which magnifies the change in current flow through MOSFET M3. This magnified variation is mirrored in MOSFET M4 and produces a magnified differential current $ΔI_o$ at the output of basic amplifier stage 10, thus increasing the gain of differential amplifier 60 without significantly increasing the capacitance at the output node (i.e., the drain of MOSFET M2).

Preferably, the channel width-to-length ratio (W/L) of MOSFETs M1A and M2A in gain enhancement stage is larger than the W/L ratio of the MOSFETs in basic amplifier stage 10. Assuming that the W/L ratio of the MOSFETs in gain enhancement stage 20 is n times the W/L ratio of the MOSFETs in basic amplifier stage 10, the following equation expresses the value of the current ΔI:

$$\Delta I = V_{diff\, gmdn} = V_{diff} \sqrt{K \frac{Wn}{L} \cdot I_{ss}} \quad (13)$$

The current $ΔI_o$ at the output of amplifier 60 is equal to the following:

$$\Delta I_o = V_{diff}(G_{mdn} + G_{md}) = V_{diff}(\sqrt{n} + 1)\sqrt{K \frac{W}{L} \cdot I_{ss}} \quad (14)$$

The total gain $A_{vo}$ of differential amplifier 60 is:

$$Avo = \frac{\Delta I_o}{V_{diff}} \cdot Z_o = \frac{2(\sqrt{n} + 1)\sqrt{K \frac{W}{L}}}{\sqrt{I_{ss}} \, (\lambda 2 + \lambda 4)} = (\sqrt{n} + 1)A_v \quad (15)$$

Substituting $G_{mdn}+G_{md}$ into Equation (9) yields the time at which clamping occurs in differential amplifier 60 (see FIG. 3B):

$$t_2 = \frac{C_o}{G_{mdn} + G_{md}} \cdot \frac{V_{cl}+}{V_{diff}} = \frac{C_o}{(\sqrt{n} + 1)\sqrt{K \frac{W}{L} \cdot I_{ss}}} \cdot \frac{V_{cl}+}{V_{diff}} \quad (16)$$

Thus the time at which clamping occurs can be accelerated either by increasing the tail current $I_{ss}$ or by increasing the W/L ratio .n between the MOSFETs in basic amplifier 10 and the MOSFETs in gain enhancement stage 20. It may be noted that the reduced t reflected in Equation (16) further justifies the assumption that t<<$R_oC_o$, on which Equation (9) is based.

As shown in FIG. 6B, the first embodiment of the invention is hereinafter referred to as a "Type I" differential amplifier.

Figure 7A:
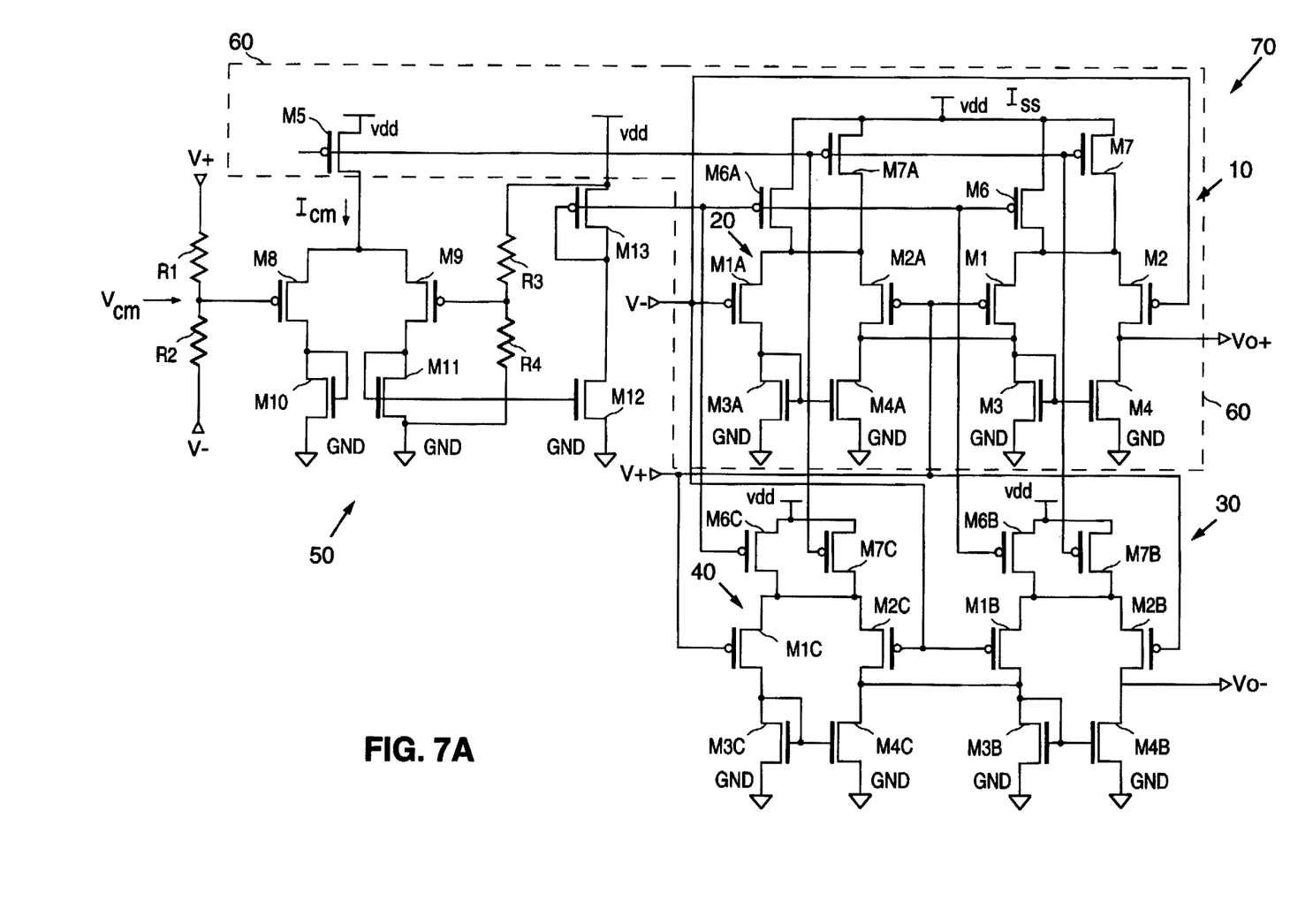
FIG. 7A illustrates a schematic circuit diagram of a differential amplifier in accordance with a second embodiment of this invention, which provides a differential output signal and includes a common mode compensation circuit.

FIG. 7A illustrates a second embodiment according to this invention. Differential amplifier 70 includes differential amplifier 60 along with an additional basic amplifier stage 30 and an additional gain enhancement stage 40. Differential amplifier 60 contains the components shown in FIG. 6A and provides an output $V_o+$. As shown in FIG. 6A, the V− input is applied to the gates of MOSFETs M1A and M2, and the V+ input is applied to the gates of MOSFETs M2A and M1.

Basic amplifier stage 30 is identical to basic amplifier stage 10 and gain enhancement stage 40 is identical to gain enhancement stage 20. The V+ signal is applied to the gates of MOSFETs M1C and M2B, and the V− signal is applied to the gates of MOSFETs M2C and M1B. Thus, in stages 30 and 40, the input terminals are reversed as compared the input terminals in stages 10 and 20. An output signal $V_o-$, which is complementary to $V_o+$ is delivered from basic amplifier stage 30.

As Equation (16), indicates, the time required to reach the clamping voltage $V_{c1}+$ can be reduced by increasing the tail current $I_{ss}$. Recognizing that the distortion problem becomes more severe as the common mode voltage $V_{cm}$ increases, a common mode compensation circuit 50 provides an increased tail current to stages 10, 20, 30 and 40 as $V_{cm}$ increases. Common mode compensation circuit 50 includes a pair of current-splitting MOSFETs M8 and M9. A voltage divider including equal resistors R1 and R2 provides an input to circuit 50 at the gate of MOSFET M8. Since V+ and V− are applied to the ends of the voltage divider respectively and since resistors R1 and R2 are equal, the voltage at the center point of the voltage divider is equal to $V_{cm}$. As $V_{cm}$ increases, the current through PMOSFET M8 is reduced, and a greater portion of the tail current $I_{cm}$ flows through MOSFETs M9 and M11. The current through MOSFET M11 is mirrored into MOSFET M12, which is connected in series with MOSFET M13. The greater current through M13 is then mirrored into MOSFETs M6, M6A, M6B and M6C where it serves to increase the tail currents supplied to stages 10, 20, 30 and 40.

A second voltage divider within common mode compensation circuit 50 includes resistors R3 and R4, which provide an output to the gate of MOSFET M9. The ratio of resistors R3 and R4 is set such that when $V_{cm}$ is equal to zero, no compensation current flows through MOSFETs M6, M6A, M6B and M6C; and when $V_{cm}=2/3V_{dd}$ a compensation current equal to $I_{cm}$ flows through MOSFETs M6, M6A, M6B and M6C. This represents the maximum compensation current. As will be apparent, common mode compensation circuit 50 could also be used to supply a compensation current to differential amplifier 60 alone.

Figure 7B:
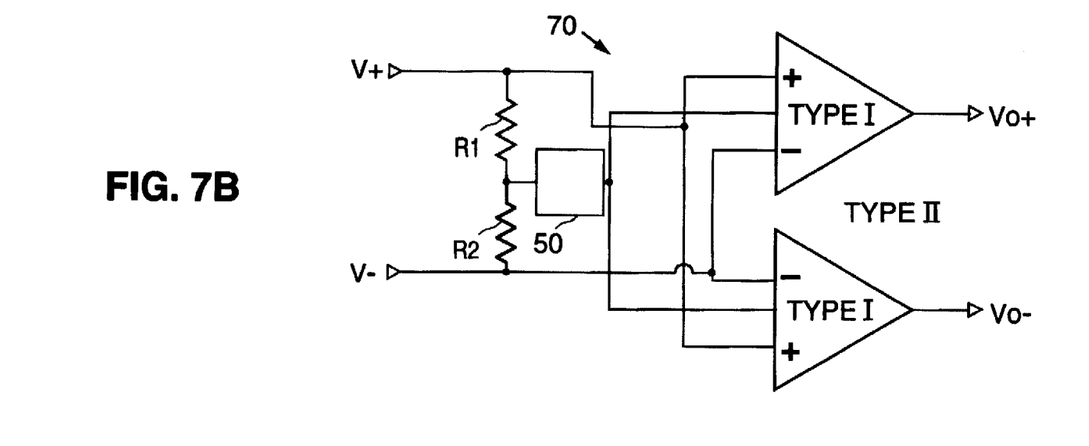
FIG. 7B illustrates a block diagram of the second embodiment of this invention.
Figure 7C:
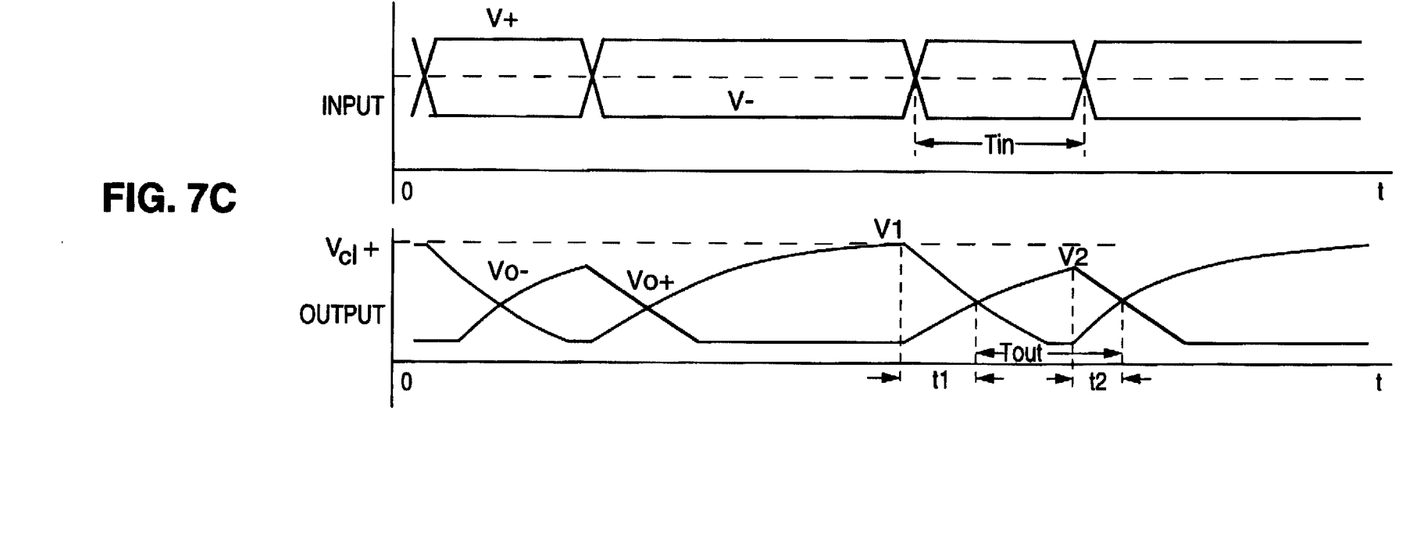
FIG. 7C illustrates a graph showing the input and output signals of the embodiment shown in FIGS. 7A and 7B.

FIG. 7C shows the response of output signals $V_o+$ and $V_o-$ to the switching of input signals V+ and V−. As is apparent from FIG. 7C, distortion may occur even when $V_{c1}+$ is less than the asymptotic limit of the output signal. During one transition of the input signals V+ and V−, the output $V_o+$ reaches a voltage V1 while during the next transition of the input signals the output voltage $V_o-$ reaches a lower voltage V2. Since t1 does not equal t2, $T_{in}$ does not equal $T_{out}$. Increasing the gain of the amplifier would increase V2 to the point where V2=$V_{c1}+$, at which point t1=t2. As described above, this can be accomplished by increasing the factor n which represents the ratio of W/L between the basic amplifier stage and the gain enhancement stage, or by increasing the tail current $I_{ss}$.

FIG. 7B illustrates a block diagram of differential amplifier 70, showing the interconnections between the two "Type I" amplifiers and the common mode compensation circuit 50, a configuration which is referred to herein as "Type II".

Figures 8A, 8B:
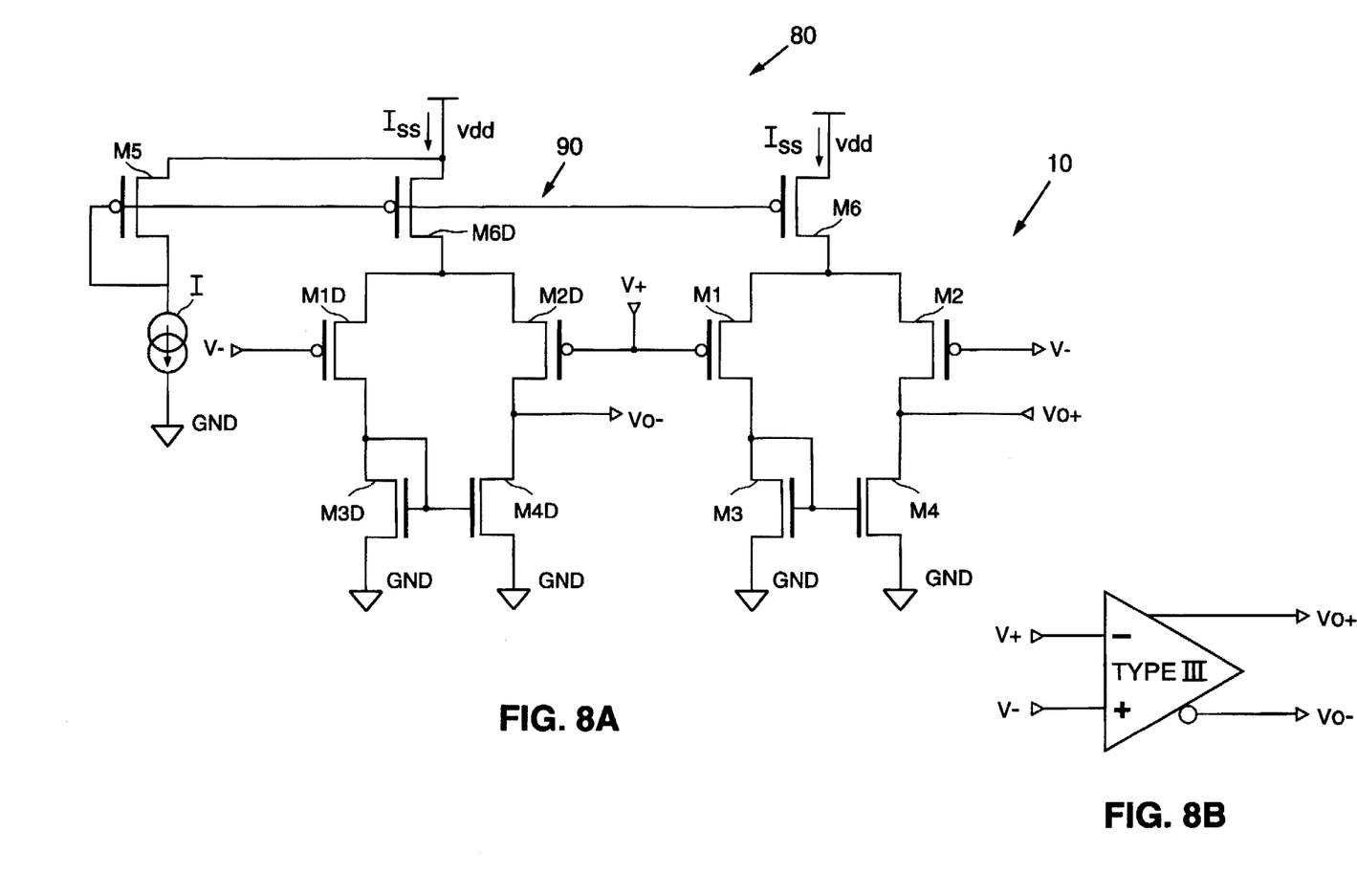
FIG. 8A illustrates a schematic circuit diagram of a differential amplifier in accordance with a third embodiment of this invention.
FIG. 8B illustrates a symbol used to designate a differential amplifier in accordance with the third embodiment of this invention.

FIG. 8A illustrates a schematic circuit diagram of a third embodiment according to this invention, which provides a differential output signal. Differential amplifier 80 includes differential amplifier 10 along with an identical differential amplifier 90. Differential amplifiers 10 and 90 are both supplied with tail currents $I_{ss}$ which are mirrored from MOSFET M5. The input terminals of amplifiers 10 and 90 are reversed, with V+ being applied to MOSFETs M1 and M2D and V− being applied to MOSFETs M2 and M1D. Thus differential amplifier 10 provides an output signal $V_o+$ while differential amplifier 90 provides a complementary output signal $V_o-$.

Differential amplifier 80 is hereinafter identified as "Type III" and identified by the symbol shown in FIG. 8B.

Figure 9A:
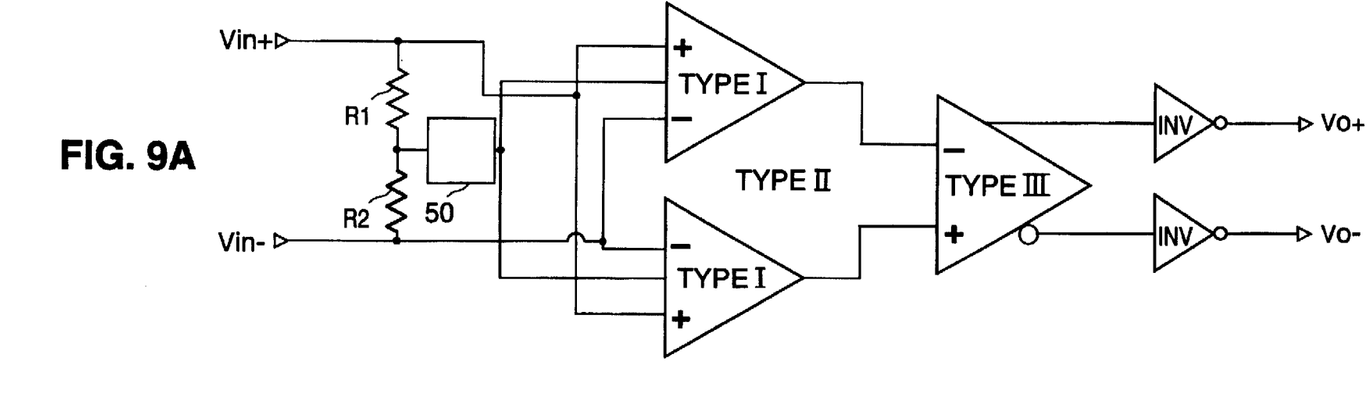
FIGS. 9A–9D illustrate several illustrative combinations of amplifiers according to the first, second and third embodiments of this invention.
Figure 9B:
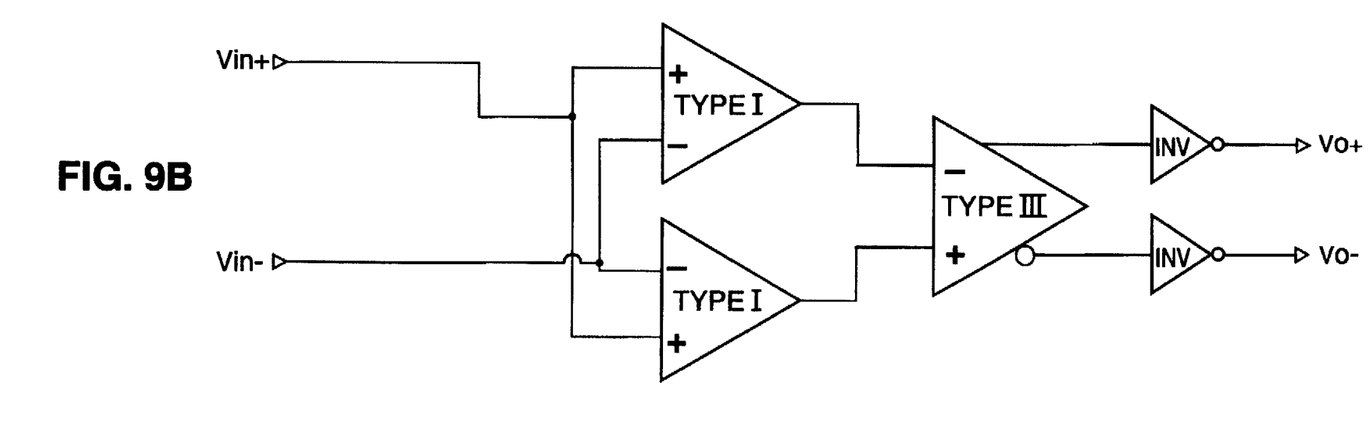
Figure 9C:
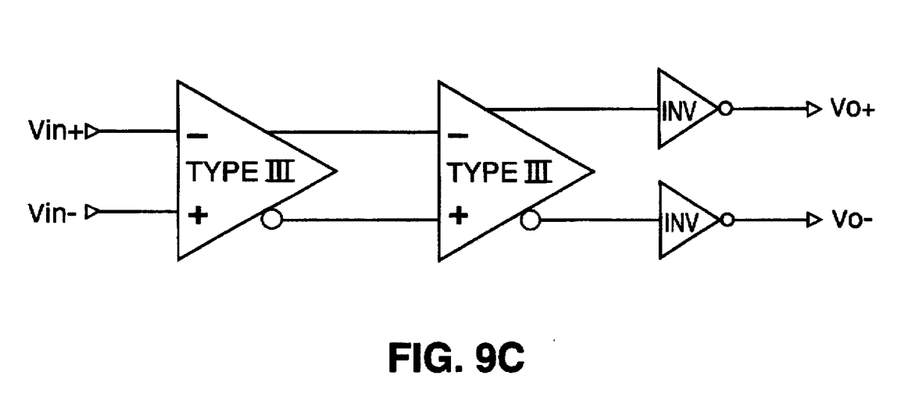
Figure 9D:
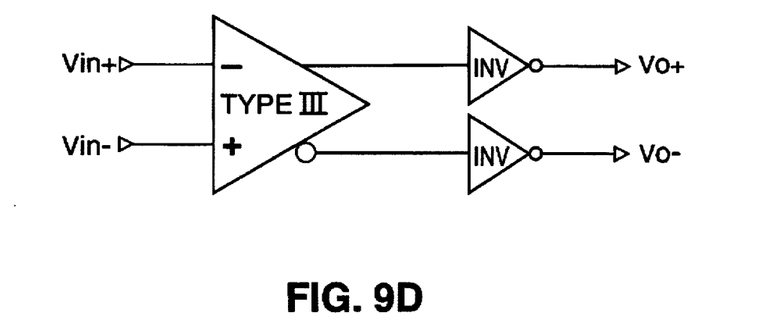

Embodiments according to this convention can be connected in various combinations to achieve particular results. FIGS. 9A–9D illustrate several of these combinations. FIG. 9A shows a high sensitivity line receiver which includes a "Type II" amplifier (FIG. 7B) with its differential outputs connected to a "Type III" amplifier (FIG. 8B). The outputs of the Type III amplifier are connected to a pair of inverters. FIG. 9B shows a similar high sensitivity line receiver without the common mode compensation circuit 50. FIG. 9C illustrates a medium sensitivity line receiver which includes two Type III amplifiers connected in series, with the differential outputs of the final amplifier being connected to a pair of inventors. FIG. 9D illustrates a line receiver or differential to CMOS translator which includes a single Type III amplifier with its outputs connected to a pair of inverters.

While specific embodiments according to this invention have been described, it will be apparent to those skilled in the art that numerous alternative embodiments may be constructed in accordance with the broad principles of this invention. This invention, as defined in the following claims is intended to cover all such embodiments.

I claim:

1. A transmission line receiver comprising:
   a first basic differential amplifier stage comprising:
     first and second conduction paths connected in parallel;
     a first current-splitting transistor and a first current mirror transistor connected in said first conduction path;
     a second current-splitting transistor and a second current mirror transistor connected in said second conduction path; and
     a first output terminal connected to a common node between said first current-splitting transistor and said first current mirror transistor; and a first gain enhancement stage comprising:
     third and fourth conduction paths connected in parallel;
     a third current-splitting transistor and a third current mirror transistor connected in said third conduction path;
     a fourth current-splitting transistor and a fourth current mirror transistor connected in said fourth conduction path; and
   a conductor connecting a common node between said third current-splitting transistor and said third current mirror transistor directly to a common node between said second current-splitting transistor and said second current mirror transistor.

2. The transmission line receiver of claim 1 wherein a first differential input signal is applied to said second and third current-splitting transistors and a second differential input signal is applied to said first and fourth current splitting transistors.

3. The transmission line receiver of claim 1 wherein said first, second, third and fourth current-splitting transistors comprise first, second, third and fourth current-splitting MOSFETs, respectively.

4. The transmission line receiver of claim 1 further comprising a second basic differential amplifier stage and a second gain enhancement stage, a second output terminal being connected to said second basic differential amplifier stage, said first output terminal being for providing a first differential output signal, said second output terminal being for providing a second output signal, said second basic differential amplifier stage and said second gain enhancement stage being coupled to said first basic differential amplifier stage and said first gain enhancement stage such that said first and second output signals being complementary to each other.

5. The transmission line receiver of claim 1 further comprising:
   a fifth transistor forming at least a part of said first conduction path, said fifth transistor comprising a first terminal connected to a terminal of each of said first and second current-splitting transistors, said fifth transistor further comprising a second terminal; and a sixth transistor forming at least a part of said third conduction path, said sixth transistor comprising a third terminal connected to a terminal of each of said third and fourth current-splitting transistors, said sixth transistor having a fourth terminal, said second terminal and said fourth terminal having a same voltage.

6. The transmission line receiver of claim 5 wherein a gate of said fifth transistor is electrically connected to a gate of said sixth transistor.

7. The transmission line receiver of claim 1 wherein a channel width-to-length ratio of said third and fourth current-splitting transistors is greater than a channel width-to-length ratio of said first and second current-splitting transistors.

8. The transmission line receiver of claim 1 further comprising:

a second basic differential amplifier stage comprising:
fifth and sixth conduction paths connected in parallel;
a fifth current-splitting transistor and a fifth current mirror transistor connected in said fifth conduction path;
a sixth current-splitting transistor and a sixth current mirror transistor connected in said sixth conduction path; and
a second output terminal connected to a common node between said fifth current-splitting transistor and said fifth current mirror transistor; and a second gain enhancement stage comprising:
seventh and eighth conduction paths connected in parallel;
a seventh current-splitting transistor and a seventh current mirror transistor connected in said seventh conduction path; and
an eighth current-splitting transistor and an eighth current mirror transistor connected in said eighth conduction path;
wherein each of said first through eighth current-splitting transistors has a control terminal;
said control terminals of each of said second, third, fifth and eighth current-splitting transistor being electrically coupled, and
said control terminals of each of said first, fourth, sixth and seventh current-splitting transistors being electrically coupled.

9. The transmission line receiver of claim 8 further comprising a common node between said seventh current-splitting transistor and said seventh current mirror transistor connected to a common node between said sixth current-splitting transistor and said sixth current mirror transistor.

10. The transmission line receiver of claim 9 wherein said first output terminal is for providing a first differential output signal, said second output terminal is for providing a second output signal, and said first and second output signals are complementary to each other.

11. The transmission line receiver of claim 9 further comprising a second basic differential amplifier stage and a second gain enhancement stage, a second output terminal being connected to said second basic differential amplifier stage, said first output terminal being for providing a first differential output signal, said second output terminal being for providing a second output signal, said second basic differential amplifier stage and said second gain enhancement stage being coupled to said first basic differential amplifier stage and said first gain enhancement stage such that said first and second output signals are complementary to each other.

12. A transmission line receiver comprising:
a first basic differential amplifier stage comprising:
first and second conduction paths connected in parallel;
a first current-splitting transistor and a first current mirror transistor connected in said first conduction path;
a second current-splitting transistor and a second current mirror transistor connected in said second conduction path; and
a first output terminal connected to a common node between said first current-splitting transistor and said first current mirror transistor; and a first gain enhancement stage comprising:
third and fourth conduction paths connected in parallel;
a third current-splitting transistor and a third current mirror transistor connected in said third conduction path;
a fourth current-splitting transistor and a fourth current mirror transistor connected in said fourth conduction path;
a common node between said third current-splitting transistor and said third current mirror transistor being connected to a common node between said second current-splitting transistor and said second current mirror transistor; wherein a channel width-to-length ratio of said third and fourth current-splitting transistors is greater than a channel width-to-length ratio of said first and second current-splitting transistors.

13. A transmission line receiver comprising:
a first basic differential amplifier stage comprising:
first and second conduction paths connected in parallel;
a first current-splitting transistor and a first current mirror transistor connected in said first conduction path;
a second current-splitting transistor and a second current mirror transistor connected in said second conduction path; and
a first output terminal connected to a common node between said first current-splitting transistor and said first current mirror transistor; and
a first gain enhancement stage comprising:
third and fourth conduction paths connected in parallel;
a third current-splitting transistor and a third current mirror transistor connected in said third conduction path;
a fourth current-splitting transistor and a fourth current mirror transistor connected in said fourth conduction path;
a common node between said third current-splitting transistor and said third current mirror transistor being connected to a common node between said second current-splitting transistor and said second current mirror transistor, said transmission receiver further comprising a fifth current mirror transistor connected to said first and second conduction paths and a common mode compensation circuit connected to said fifth current mirror transistor, said common mode compensation circuit comprising:
fifth and sixth conduction paths connected in parallel;
a fifth current-splitting transistor connected in said fifth conduction path;
a sixth current-splitting transistor and a sixth current mirror transistor connected in said sixth conduction path;
wherein a current through said sixth current mirror transistor is mirrored to said fifth current mirror transistor.

14. The transmission line receiver of claim 13 wherein a common mode voltage for said first and second differential input signals is applied to said fifth current-splitting transistor.

15. The transmission line receiver of claim 13 wherein said fifth current-splitting transistor comprises a MOSFET, said common node compensation circuit further comprising a voltage divider comprising a pair of equal resistors, said first and second differential input signals being applied to end terminals of said voltage divider, respectively, a midpoint of said voltage divider being connected to a gate of said MOSFET.

16. The transmission line receiver of claim 13 wherein said sixth current-splitting transistor comprises a MOSFET, said common mode compensation circuit further comprising a voltage divider, first and second constant voltages being applied to end terminals of said voltage divider, respectively, a midpoint of said voltage divider being connected to a gate of said MOSFET.

17. A common mode compensation circuit for adjusting the magnitude of a tail current in response to the magnitude of a common mode voltage, said common mode compensation circuit comprising:

first and second conduction paths connected in parallel;

a current source for supplying a current to said first and second conduction paths;

a first current-splitting transistor connected in said first conduction path, an input terminal for said common mode voltage being connected to a control electrode of said first current-splitting transistor;

a second current-splitting transistor and a first current mirror transistor connected in said second conduction path, an output terminal being connected to a control electrode of said first current mirror transistor.

18. The common mode compensation circuit of claim 17 wherein a current through said first current mirror transistor is mirrored to a second current mirror transistor.

19. The common mode compensation circuit of claim 17 wherein said first current-splitting transistor comprises a MOSFET, said common mode compensation circuit further comprising a voltage divider comprising a pair of equal resistors, first and second differential input signals being applied to end terminals of said voltage divider, respectively, a midpoint of said voltage divider being connected to a gate of said MOSFET.

20. The common mode compensation circuit of claim 17 wherein said second current-splitting transistor comprises a MOSFET, said common mode compensation circuit further comprising a voltage divider, first and second constant voltages being applied to end terminals of said voltage divider, respectively, a midpoint of said voltage divider being connected to a gate of said MOSFET.

* * * * *

UNITED STATES PATENT AND TRADEMARK OFFICE
CERTIFICATE OF CORRECTION

PATENT NO.   :   5,701,102
DATED        :   December 23, 1997
INVENTOR(S)  :   Kuo, James R.

It is certified that error appears in the above-identified patent and that said Letters Patent is hereby corrected as shown below:

Claim 11, line 1, delete "9" and insert --1--.

Signed and Sealed this

Twenty-eighth Day of July, 1998

*Attest:*

BRUCE LEHMAN

*Attesting Officer*    *Commissioner of Patents and Trademarks*